United States Patent [19]

Terakado

[11] Patent Number: 5,468,927
[45] Date of Patent: Nov. 21, 1995

[54] WIRE BONDING APPARATUS

[75] Inventor: Yoshimitsu Terakado, Tokyo, Japan

[73] Assignee: Kabushiki Kaisha Shinkawa, Tokyo, Japan

[21] Appl. No.: 309,936

[22] Filed: Sep. 21, 1994

[30] Foreign Application Priority Data

Sep. 21, 1993 [JP] Japan .................................. 5-257645

[51] Int. Cl.⁶ ......................... B23K 20/10; B23K 101/38
[52] U.S. Cl. ..................... 219/56.21; 228/4.5; 228/179.1
[58] Field of Search ............................. 219/56.21, 56.22; 228/179.1, 4.5

[56] References Cited

U.S. PATENT DOCUMENTS 5,031,821  7/1991  Kaneda et al. ...................... 228/179.1
5,037,023  8/1991  Akiyama et al. .................... 228/179.1
5,058,797  10/1991 Terakado et al. ................... 228/179.1
5,238,173  8/1993  Ura et al. ............................. 228/4.5

FOREIGN PATENT DOCUMENTS 2-298874  12/1990  Japan .

Primary Examiner—Clifford C. Shaw
Attorney, Agent, or Firm—Koda and Androlia

[57] ABSTRACT

A wire bonding apparatus including a wire-cutting clamper and an electrical wire connection clamper which is installed above the wire-cutting clamper, the electrical wire connection clamper being electrically connected, selectively via a switch, to an electric torch power supply and a power supply used for detecting faulty wire connections.

6 Claims, 4 Drawing Sheets

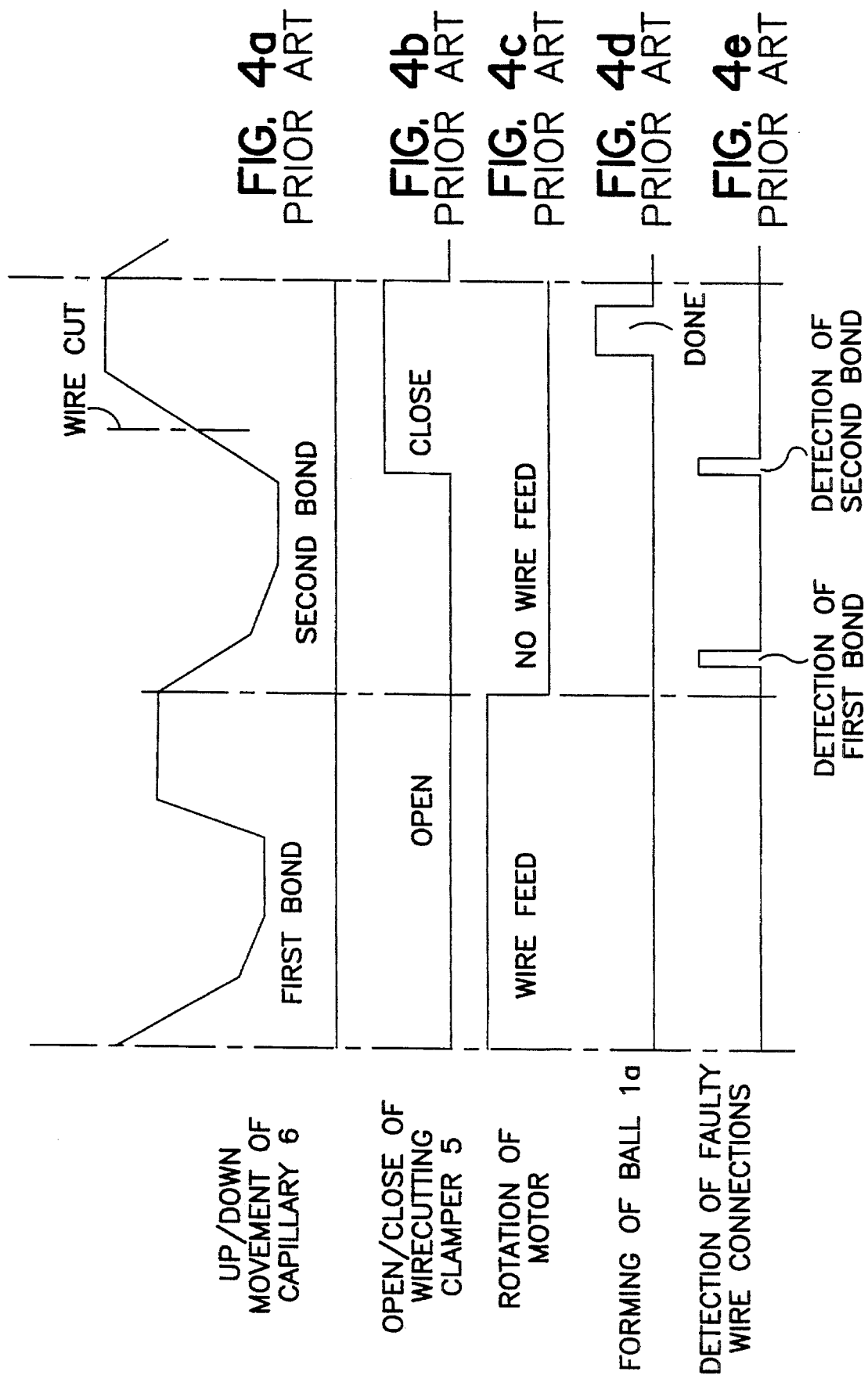

WIRE BONDING APPARATUS

BACKGROUND OF THE INVENTION

1. Field of the Invention

The present invention relates to a wire bonding apparatus.

2. Prior Art

A conventional wire bonding apparatus is shown in FIG. 3.

A spool 2 with a bonding wire 1 wound around it is attached to a spool holder 3, and this spool holder 3 is rotated by a spool-rotating motor 4. One end of the bonding wire 1 is passed through a wire-cutting clamper 5 and then a capillary 6, while the other end of the bonding wire 1 is connected to the ground terminal 7 of the spool holder 3. A wire slack forming means 8 which includes a nozzle for blowing air against the bonding wire 1 is installed above the wire-cutting clamper 5. The wire slack forming means 8 creates slack in the bonding wire 1 and causes the ball 1a formed at the tip of the bonding wire 1 to come in contact with the capillary 6. The wire slack forming means 8 can suck the air instead of blowing the air to the bonding wire 1.

An electric torch power supply 10 for forming the ball 1a on the bonding wire 1 by applying a high voltage to the bonding wire is connected to the wire-cutting clamper 5 via an electric torch 11 and a switch 12. In order to detect faulty wire connections, a slip ring 14 is mounted on the spool shaft 13 of the spool holder 3, and a power supply 15 used for the detection of faulty wire connections is connected to the slip ring 14 via the switch 12. Faulty wire connections are detected by a faulty wire connection detector 16. Thus, the switch 12 is connected to the electric torch power supply 10 only during the formation of the ball 1a.

Japanese Patent Application Laid-Open (Kokai) No. 2-298874 discloses an example of the faulty wire connection detecting means.

The above described bonding apparatus operates in accordance with the time chart shown in FIG. 4.

FIG. 4a shows the timing of the raising and lowering of the capillary 6, FIG. 4b shows the timing of the opening and closing of the wire-cutting clamper 5, FIG. 4c shows the timing of the wire feeding, i.e., the operation of the spool-rotating motor 4, FIG. 4d shows the timing of the formation of the ball 1a, and FIG. 4e shows the timing of the detection of faulty wire connections.

First, the switch 12 is operated so as to be connected to the electric torch power supply 10. A high voltage is applied from the electric torch power supply 10 to the electric torch 11 and also to the bonding wire 1 that passes through the wire-cutting clamper 5. Thus, the ball 1a is formed at the tip of the bonding wire 1 by the discharge of the electric torch 11. After the ball 1a has thus been formed, the switch 12 is connected to the power supply 15 used for the detection of faulty wire connections.

The capillary 6 is next lowered, and the ball 1a is bonded to the first bonding point (called "first bond"). Afterward, the capillary is raised and moved to a position above the second bonding point and then again lowered.

During this period, a voltage is applied to the bonding wire 1 by the power supply 15 used for the detection of faulty wire connections via the slip ring 14, spool shaft 13, spool holder 3 and ground terminal 7. Thus, the bonding condition at the first bonding point is detected. If the wire connection is normal, the lowering of the capillary 6 is continued, and the bonding wire 1 is bonded to the second bonding point (called "second bond").

Afterward, the wire-cutting clamper 5 is closed, and the capillary 6 is raised. When the capillary 6 has been raised to a predetermined height, the wire-cutting clamper 5 is raised, and the bonding wire 1 is cut at a bonded point base of the second bonding point. During the period between the completion of the second bond and the cutting of the bonding wire, a voltage is applied to the bonding wire 1 by the power supply 15 used for the detection of faulty wire connections, and the bonding at the second bonding point is detected.

As seen from the above, the bonding wire 1 must be electrically connected to the electric torch power supply 10 when the ball 1a is formed. In addition, the bonding wire 1 must be electrically connected to the power supply 15 used for the detection of faulty wire connections when faulty wire connections are detected.

In these cases, the electrical connection of the electric torch power supply 10 to the bonding wire 1 for the purpose of forming the ball 1a is accomplished via the wire-cutting clamper 5. However, the main purpose of this wire-cutting clamper 5 is to securely clamp and cut the bonding wire 1. If the wire-cutting clamper 5 is thus used for such an electrical connection for forming the ball 1a too, the wire-cutting clamper 5 may be damaged by electrical discharge phenomena that occurs between the bonding wire 1 and the wire-cutting clamper 5. This results a drop in the clamping capacity of the wire-cutting clamper 5.

Furthermore, in the prior art as described above, the electrical connection of the power supply 15 to the bonding wire 1 for detecting faulty wire connections is accomplished via the slip ring 14, spool shaft 13, spool holder 3 and ground terminal 7. Accordingly, whenever the spool 2 is changed, the bonding wire 1 must be reconnected to the ground terminal 7. Furthermore, the electrical connection to the bonding wire 1 is accomplished by the fixed slip ring 14 via the rotating spool holder 3 and spool shaft 13. Thus, the structure tends to be complex. In addition, since slipping members (slip ring, spool shaft, etc.) are used, debris tends to generate.

SUMMARY OF THE INVENTION

Accordingly, the first object of the present invention is to provide a wire bonding apparatus which can increase the useful life of the wire-cutting clamper and allows stable wire bonding (or wire cutting).

The second object of the present invention is to provide a wire bonding apparatus in which the spool change can be done easily and in which the structure of the spool drive means can be simple.

The first object is accomplished by a unique structure (a first structure) wherein a clamper used for electrical connection of the bonding wire is installed above a wire-cutting clamper, and the clamper used for electrical connection of the bonding wire is electrically connected to an electric torch power supply.

The second object is accomplished by another unique structure (a second structure) in which a clamper used for electrical connection of the bonding wire is installed above a wire-cutting clamper, and the clamper used for electrical connection of the bonding wire is electrically connected to a power supply used for the detection of faulty wire connections and not to an electric torch power supply.

The first and second objects of the present invention are accomplished by still another unique structure (a third structure) in which a clamper used for electrical connection of the bonding wire is installed above a wire-cutting clamper, and the clamper used for electrical connection of the bonding wire is electrically connected to not only an electric torch power supply and but also a power supply used for the detection of faulty wire connections.

In the first structure, the electric torch power supply is electrically connected to the bonding wire via the clamper used for electrical connection of the bonding wire. In other words, the electrical connection of the electric torch power supply to the bonding wire for the purpose of forming the ball on the bonding wire is accomplished via the clamper used for electrical connection of the bonding wire and not via the wire-cutting clamper as in the prior art. Accordingly, the useful life of the wire-cutting clamper can be lengthened, and stable wire bonding can be accomplished.

In the second structure, the power supply used for the detection of faulty wire connections is electrically connected to the bonding wire via the clamper used for electrical connection of the bonding wire. In other words, the electrical connection of the power supply used for the detection of faulty wire connections to the bonding wire for the purpose of detecting faulty wire connections is accomplished via the clamper used for electrical connection of the bonding wire. Accordingly, there is no need to connect the bonding wire to a ground terminal, and changing of the spool is facilitated. Furthermore, the spool-rotating driving means is simple in structure, and since no slipping part such as a slip ring is used, debris will not be generated.

The third structure includes the first and second structures as described above and thus has the effects and merits of both of the structures.

BRIEF DESCRIPTION OF THE DRAWINGS

FIG. 4a–4e are timing charts of the apparatus shown in FIG. 3.

DETAILED DESCRIPTION OF THE INVENTION

One embodiment of the present invention will be described with reference to FIGS. 1 and 2. Parts which are the same as those in FIGS. 3 and 4 or which correspond to such parts are labeled with the same symbols and will not be described in detail.

Figure 1:
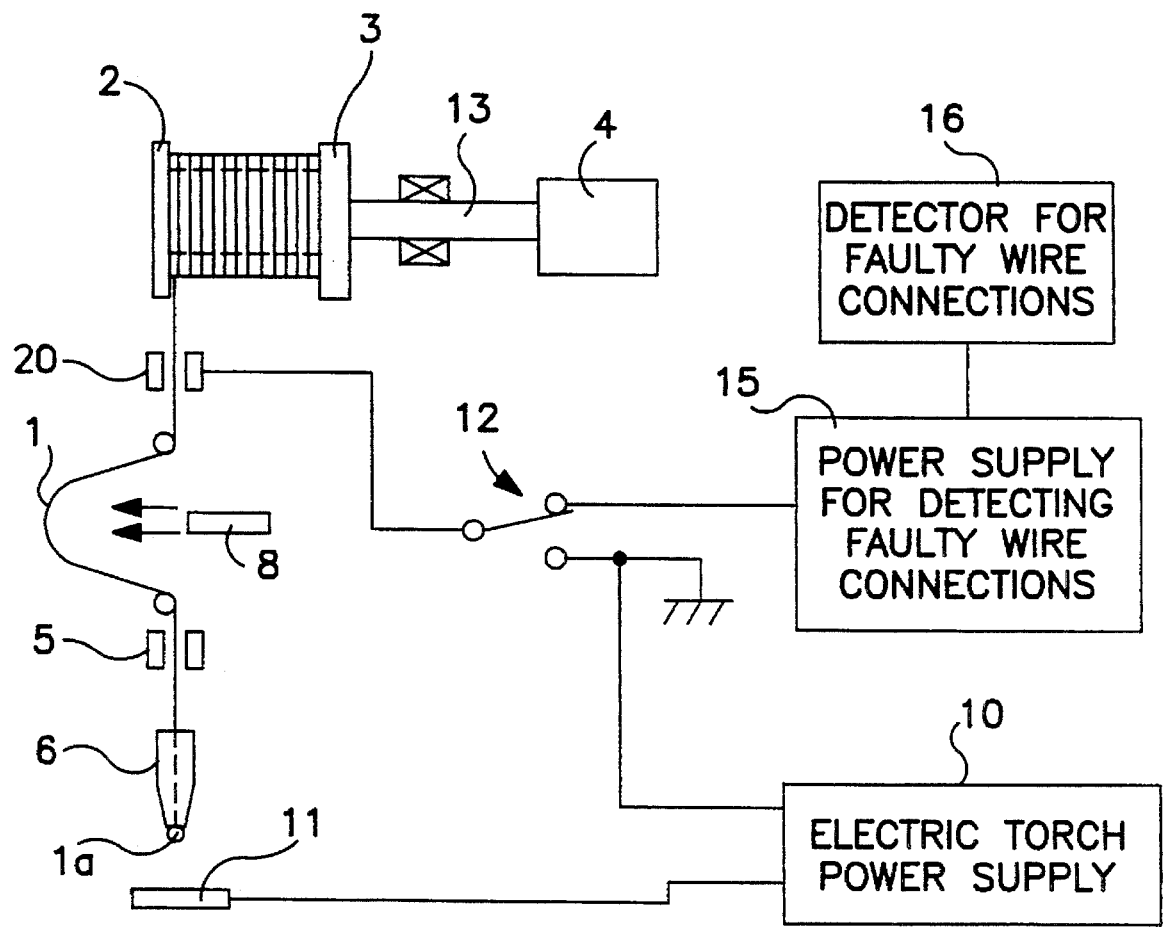
FIG. 1 is a schematic explanatory diagram of the essential portion of one embodiment of the wire bonding apparatus of the present invention.

As shown in FIG. 1 and as in the prior art described above, a spool 2 with a bonding wire 1 wound thereon is attached to a spool holder 3. The spool holder 3 is rotated by a spool-rotating motor 4. One end of the bonding wire 1 is passed through a wire-cutting clamper 5 and then a capillary 6. A wire slack forming means 8 is installed above the wire-cutting clamper 5. An electric torch 11 is installed beneath the capillary 6. These elements, that is the spool 2, the slack forming means 8, the wire-cutting clamper 5, the capillary 6 and the electric torch 11 are arranged vertically.

An electric torch power supply 10 for forming the ball 1a on the bonding wire 1 by applying a high voltage to the bonding wire is connected to the electric torch 11 and a switch 12. A power supply 15 which is used for the detection of faulty wire connections as in the prior art is provided in the bonding apparatus.

In addition, a clamper 20 used for electrical connection of the bonding wire (called "electrical wire connection clamper 20") is installed above the wire slack forming means 8. The electrical wire connection clamper 20 is connected to a switch 12. The switch 12 is designed so that it connects the electrical wire connection clamper 20 to either the power supply 15 used for the detection of faulty wire connections or the electric torch power supply 10.

The switch 12 makes an electrical connection between the electrical wire connection clamper 20 and the electric torch power supply 10 when the ball 1a is formed. In other words, the electric torch power supply 10 is electrically connected to the bonding wire 1 via the electrical wire connection clamper 20 when the clamper 20 is closed by such an electrical connection, and a high voltage is applied to the bonding wire 1, thus forming the ball 1a at the end of the bonding wire 1.

In addition, the switch 12 makes an electrical connection between the electrical wire connection clamper 20 and the power supply 15 used for the detection of faulty wire connections so that any faulty wire connection can be detected. In other words, when the power supply 15 is connected to the electrical wire connection clamper 20 via the switch 12, the clamper 20 is closed, and a voltage is applied to the bonding wire 1 by the power supply 15 so that the bonding conditions at bonding points are detected.

Figure 2:
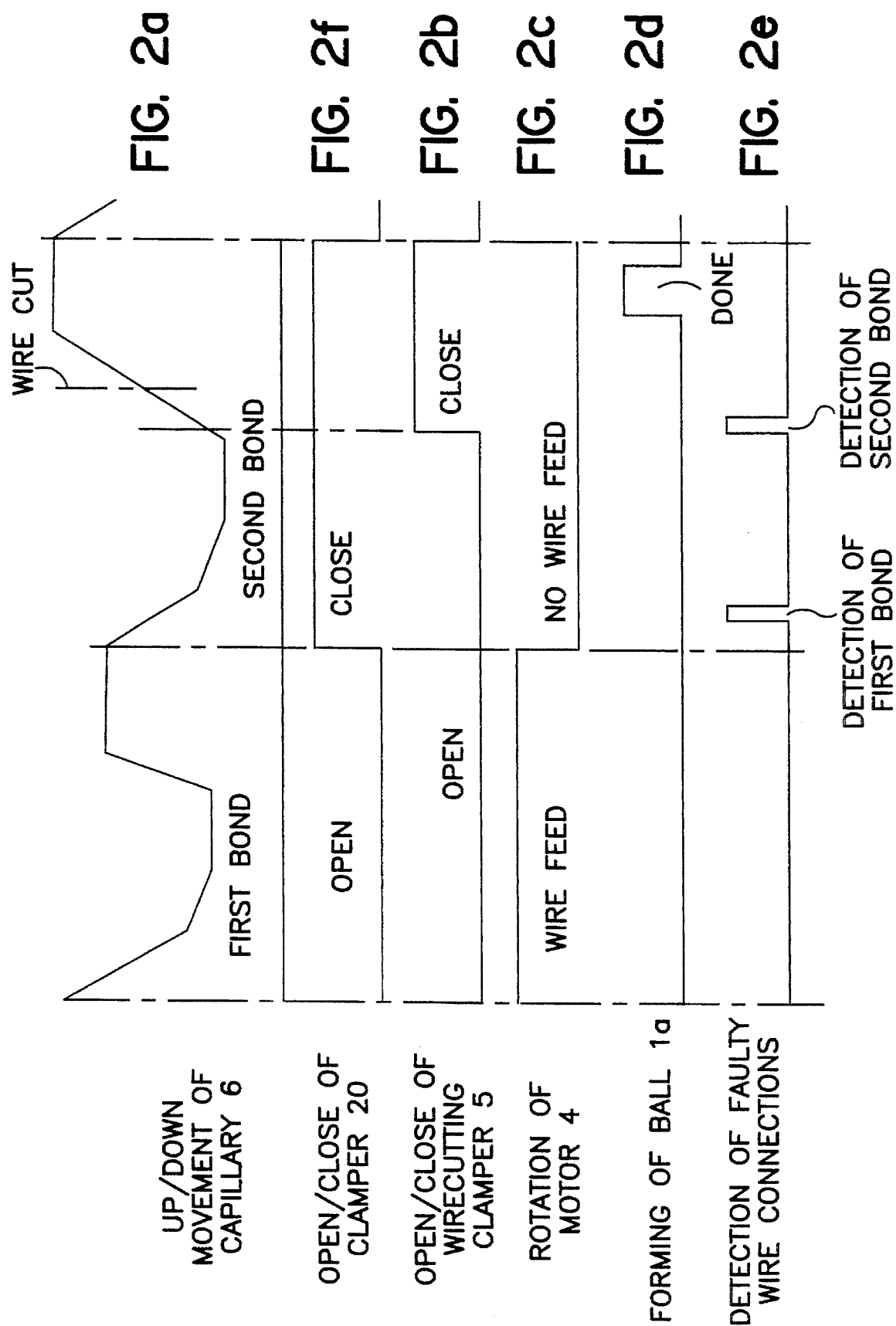
FIGS. 2a–2f are timing charts of the apparatus shown in FIG. 1.
Figure 3:
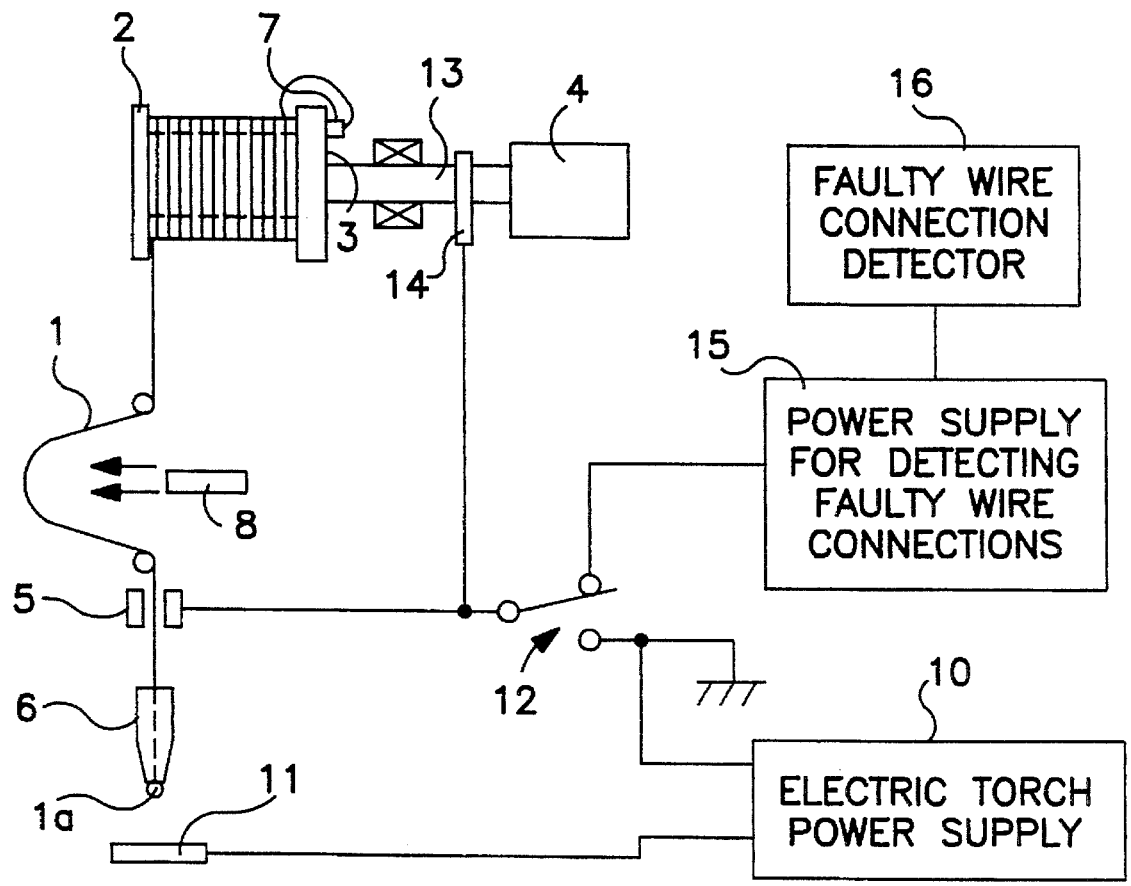
FIG. 3 is a schematic explanatory diagram of the essential parts of a conventional wire bonding apparatus.

FIG. 2 is a timing chart. FIG. 2a shows the timing of the raising and lowering of the capillary 6, FIG. 2b shows the timing of the opening and closing of the wire-cutting clamper 5, FIG. 2c shows the timing of the wire feeding, i.e., the operation of the spool-rotating motor 4, FIG. 2d shows the timing of the formation of the ball 1a, and FIG. 2e shows the timing of detection of faulty wiring connections at the first and second bonding points.

The timings in these FIGS. 2a through 2e are substantially the same as those in FIGS. 4a through 4e. However, FIG. 2f shows the timing of the opening and closing of the electrical wire connection clamper 20, which is the feature of the present invention, and therefore, there is no corresponding Figure in FIG. 2.

As seen from FIG. 2f along with FIG. 2c, the electrical wire connection clamper 20 is kept closed (to clamp the bonding wire) except during the feeding of the bonding wire. In other words, the clamper 20 is closed when the wire feeding motor 4 is not in function and no bonding wire feeding is being performed. It is, however, sufficient if the electrical wire connection clamper 20 is closed at least from the time that the first bond is detected to the time that the formation of the ball 1a is completed.

Accordingly, in the present invention, the formation of the ball 1a, the detection of the first bond, the detection of the second bond and the cutting of the bonding wire are performed with the same timing as in the prior art. However, unlike the prior art, in the present invention, the switch 12 is connected to the electric torch power supply 10 when the ball 1a is formed, and the electric torch power supply 10 is thus electrically connected to the bonding wire 1 via the electrical wire connection clamper 20 and not via the wire-cutting clamper 5. In other words, a high voltage is applied to the bonding wire 1 and to the electric torch 11 via the electrical wire connection clamper 20 when the ball 1a is formed.

When the detection of the first bond and the detection of the second bond are performed, the switch 12 is connected to the power supply 15 used for the detection of faulty wire connections, and thus the power supply 15 used for the detection of faulty wire connections is electrically connected to the bonding wire 1 via the electrical wire connection clamper 20 which is closed by such an electrical connection. In other words, a voltage is applied to the bonding wire 1 via the electrical wire connection clamper 20 and not via the wire-cutting clamper 5, so that faulty wire connections are detected. The object of the electrical wire connection clamper 20 is to make an electrical connection to the bonding wire 1; therefore, there is no need for the clamper 20 to make extremely precise opening and closing operations as in the wire-cutting clamper 5.

As seen from the above, the electrical connection of the electric torch power supply 10 to the bonding wire 1 for the purpose of forming the ball 1a is accomplished via the electrical wire connection clamper 20 and not via the wire-cutting clamper 5 as in the prior art. Accordingly, the useful life of the wire-cutting clamper 5 is lengthened, and wire bonding can be stabilized.

Furthermore, since the electrical connection of the power supply 15 used for the detection of faulty wire connections to the bonding wire 1 for the purpose of detecting faulty wire connections is accomplished via the electrical wire connection clamper 20, there is no need to connect the bonding wire 1 to a ground terminal as in the prior art. Thus, the spool change can be accomplished easily. Furthermore, the structure of the rotary driving means for the spool 2 can be simple, and a reduction in manufacturing cost can be achieved. In addition, the use of a slipping part such as the slip ring 14 becomes unnecessary, and no debris is generated.

In the present invention, as seen from the above, the electric torch power supply 10 and the power supply 15 used for the detection of faulty wire connections are both connectable to the electrical wire connection clamper 20 via the switch 12. However, it is possible to design it so that only the electric torch power supply 10 is connected to the electrical wire connection clamper 20 and the power supply 15 used for the detection of faulty wire connections is connected to a slip ring 14 as in the conventional apparatus. In this case, the electrical connection of the electric torch power supply 10 to the bonding wire 1 for forming the ball 1a is accomplished via the electrical wire connection clamper 20, rather than via the wire-cutting clamper 5. Accordingly, the useful life of the wire-cutting clamper 5 is lengthened, and wire bonding can be accomplished in a stable fashion. In this case, the electrical wire connection clamper 20 may be closed only during the formation of the ball 1a, not as in the timing shown in FIG. 2f. When the electrical wire connection clamper 20 is designed so as to be closed only when the ball 1a is formed, the electrical wire connection clamper 20 may alternatively be installed above the wire-cutting clamper 5 and beneath the slack forming means 8.

It would also be possible to design it so that only the power supply 15 used for the detection of faulty wire connections is connected to the electrical wire connection clamper 20 and the electric torch power supply 10 is connected to the wire-cutting clamper 5 as in the prior art. In this case, the electrical connection of the power supply 15 used for the detection of faulty wire connections to the bonding wire 1 for the purpose of detecting faulty wire connections is accomplished via the electrical wire connection clamper 20, and there is no need to connect the bonding wire 1 to a ground terminal 7 as in the prior art. Thus, the changing of the spool is facilitated.

In addition, the rotary driving means for the spool 2 can be simplified, and it is possible to reduce the manufacturing cost of the bonding apparatus. Also, since no slipping member such as the slip ring 14 is used, no debris would be generated. In such a case, the electrical wire connection clamper 20 may be closed from the time that the first bond is initially detected till the time that the cutting of the bonding wire is completed, unlike the timing shown in FIG. 2f. However, it goes without saying that a better effect is obtained if the electric torch power supply 10 and the power supply 15 used for the detection of faulty wire connections are both designed so as to be connectable to the electrical wire connection clamper 20 as described above.

As seen from the above, according to the present invention, a clamper used for electrical connection of the bonding wire is installed above a wire-cutting clamper and electrically connected to an electric torch power supply. Accordingly, the useful life of the wire-cutting clamper is lengthened, and wire bonding can be stabilized.

In addition, according to the present invention, a clamper used for electrical connection of the bonding wire is installed above a wire-cutting clamper and electrically connected to a power supply used for the detection of faulty wire connections. Accordingly, the spool changing operation is improved, and the structure of the spool driving means is simplified, so that a cost reduction is accomplished.

Furthermore, according to the present invention, a clamper used for electrical connection of the bonding wire is installed above a wire-cutting clamper and electrically connectable to both an electric torch power supply and a power supply used for the detection of faulty wire connections. This structure has such advantages that the useful life of the wire-cutting clamper is lengthened, wire bonding can be stabilized, the spool changing operation is improved, and the structure of the spool driving means is simplified, so that a cost reduction of the bonding apparatus is accomplished.

I claim:

1. A wire bonding apparatus having a bonding wire feeding means, a capillary means for the bonding wire and a clamper means, said clamper means comprising an electrical connection clamper for a bonding wire installed upstream of a bonding wire cutting clamper, and said electrical connection clamper for said bonding wire electrically connected to an electric torch power supply.

2. A wire bonding apparatus having a bonding wire feeding means, a capillary for the bonding wire and a clamper means, said clamper means comprising an electrical connection clamper for a bonding wire installed upstream of a bonding wire cutting clamper, and said electrical connection clamper for said bonding wire electrically connected to a faulty wire connections detection power supply.

3. A wire bonding apparatus having a bonding wire feeding means, a capillary for the bonding wire and a clamper means, said clamper means comprising an electrical connection clamper for a bonding wire installed upstream of a bonding wire cutting clamper, and said electrical connection clamper for said bonding wire electrically connected to an electric torch power supply and to a faulty wire connection detection power supply.

4. A wire bonding apparatus comprising a wire spool for feeding out a bonding wire, a slack forming means for forming a slack in said bonding wire, a wire-cutting clamper for cutting said bonding wire, a capillary for guiding said bonding wire to bonding points, an electrical torch for forming a ball on said bonding wire, which are arranged vertically, an electric torch power supply connected to said electrical torch and a power supply for detecting faulty electrical connections connected to a faulty wire connection detector, said apparatus further comprising:

an electrical connection clamper for accomplishing an electrical connection between said bonding wire and said electric torch power supply or said power supply for detecting faulty electrical connections, said electrical connection clamper being provided between said wire spool and said wire cutting clamper; and a switch means for selectively connecting said electric torch power supply and said power supply for detecting faulty electrical connections to said electrical connection clamper.

5. A bonding apparatus according to claim 4, wherein said electrical connection clamper is provided above said slack forming means.

6. A bonding apparatus according to claim 4, wherein said electrical connection clamper is provided below said slack forming means.

\* \* \* \* \*